United States Patent [19]

Conte

[11] Patent Number: 4,504,832
[45] Date of Patent: * Mar. 12, 1985

[54] ABSOLUTE PRECISION TRANSDUCER FOR LINEAR OR ANGULAR POSITION MEASUREMENTS

[75] Inventor: Alberto Conte, Turin, Italy

[73] Assignee: Selca S.p.A., Ivrea, Italy

[ * ] Notice: The portion of the term of this patent subsequent to Nov. 12, 2000 has been disclaimed.

[21] Appl. No.: 125,432

[22] Filed: Feb. 28, 1980

Related U.S. Application Data

[63] Continuation of Ser. No. 905,661, May 15, 1978, abandoned.

[30] Foreign Application Priority Data

May 18, 1977 [IT] Italy .............................. 68123 A/77

[51] Int. Cl.³ ...................... G08C 19/10; G08C 19/06
[52] U.S. Cl. ............................ 340/870.37; 340/347 P; 340/870.32
[58] Field of Search ...................... 340/870.37, 870.32, 340/347 P, 347 M; 336/45, 20, 115; 323/46, 93; 324/61 R

[56] References Cited

U.S. PATENT DOCUMENTS

| | | | |
|---|---|---|---|
| 2,976,528 | 3/1961 | Greunke et al. | 340/347 P |
| 3,238,523 | 3/1966 | Masel et al. | 340/870.37 |
| 3,286,252 | 11/1966 | Bose et al. | 340/870.37 |
| 3,522,568 | 8/1970 | Hasbrouck | 336/115 |
| 3,593,115 | 7/1971 | Dym et al. | 340/870.37 |
| 3,784,897 | 1/1974 | Norrie | 340/870.37 |
| 3,961,318 | 6/1976 | Farrand et al. | 323/93 |

*Primary Examiner*—James J. Groody
*Attorney, Agent, or Firm*—Handal & Morofsky

[57] ABSTRACT

A precision cyclic position measurement transducer capable of giving an indication of the relative position of two movable transducer elements within one of a plurality of measurement cycles is combined with binary-coded and electrically coupled conductor patterns on those transducer elements so that unambiguous indication is given of one of the measurement cycles, the indication changing as the transducer position is changed from one measurement cycle to the next. The improved transducer gives an absolute indication of the relative position of the transducer elements measured in measurement cycles and the position within a measurement cycle regardless of changes in transducer position.

2 Claims, 9 Drawing Figures

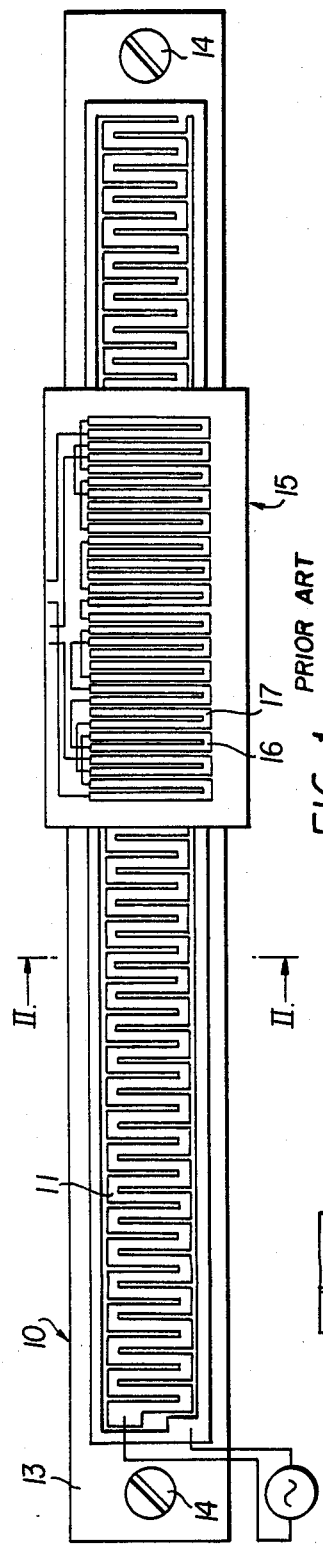
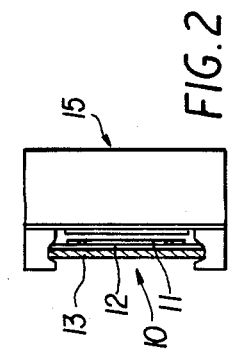
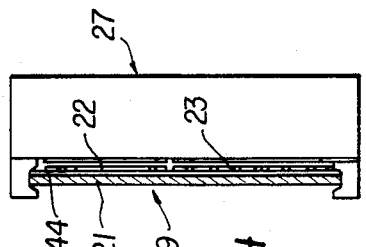
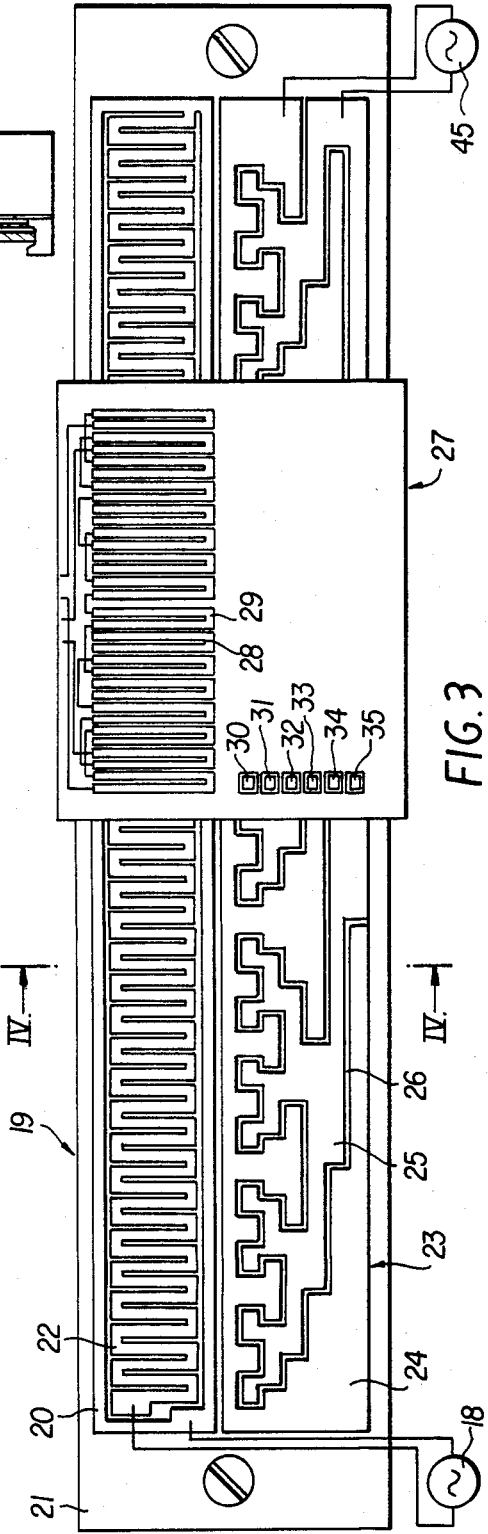

ABSOLUTE PRECISION TRANSDUCER FOR LINEAR OR ANGULAR POSITION MEASUREMENTS

This is a continuation of application Ser. No. 905,661, filed May 15, 1978, now abandoned.

FIELD OF THE INVENTION

The present invention refers to an absolute transducer of high precision for linear or angular measurements.

The transducer of this invention is formed by an absolute transducer of low precision paired with a cyclic transducer of high precision.

BACKGROUND OF THE INVENTION

Linear or angular high-precision position transducers are known, such as the Inductosyn ® transducer; such transducers, however, are only cyclic, that is, the electrical signals supplied by them repeat periodically with the relative displacement between a scale and a slider. With these transducers it is therefore possible to plot the position only within a period or cycle, but it is not possible to identify in which cycle the slider is present relative to the scale.

Normally the displacements of the slider relative to the scale are plotted by means of an electronic system which keeps a count of the number of cycles of the transducer run through during one displacement and adds to this the position plotted within the cycle.

Such a system, therefore, measures the displacements exclusively when the electronic system is operative and completely loses the position if the slider is moved with the electronic system off. As the electronic system is restarted, the position indication is lost and the starting reference must be redetermined with the aid of mechanical means.

Various systems are known for identifying with auxiliary transducers the position of each cycle of a cyclic transducer, but these known systems are very expensive and therefore rarely used.

SUMMARY OF THE INVENTION

The technical problem which the invention sets out to solve is to obtain an absolute position transducer of low cost, high reliability and easy to integrate with cyclic precision transducers of known type to obtain simultaneously high precision and absolute indication of position.

The problem is solved according to the invention with a contactless reading system of a digital code which unambiguously identifies the position of each cycle of a cyclic transducer. The transducer of the invention is characterized by the pairing of a cyclic transducer of known type with a digital transducer having a scale on which is fixed a digital code plotted by means of a slider capacitively, optionally, or inductively.

BRIEF DESCRIPTION OF THE DRAWINGS

The following is a description of a preferred embodiment given by way of example, but not in a limiting sense, with the aid of the following annexed drawings:

FIG. 1 represents schematically a plan view of a known form of an Inductosyn ® type precision transducer on a metal tape;

FIG. 2 shows a section along line II—II of FIG. 1;

FIG. 3 shows schematically in plan the transducer according to the invention;

FIG. 4 shows a section along line IV—IV of FIG. 3;

DESCRIPTION OF THE PREFERRED EMBODIMENT

Figure 5:
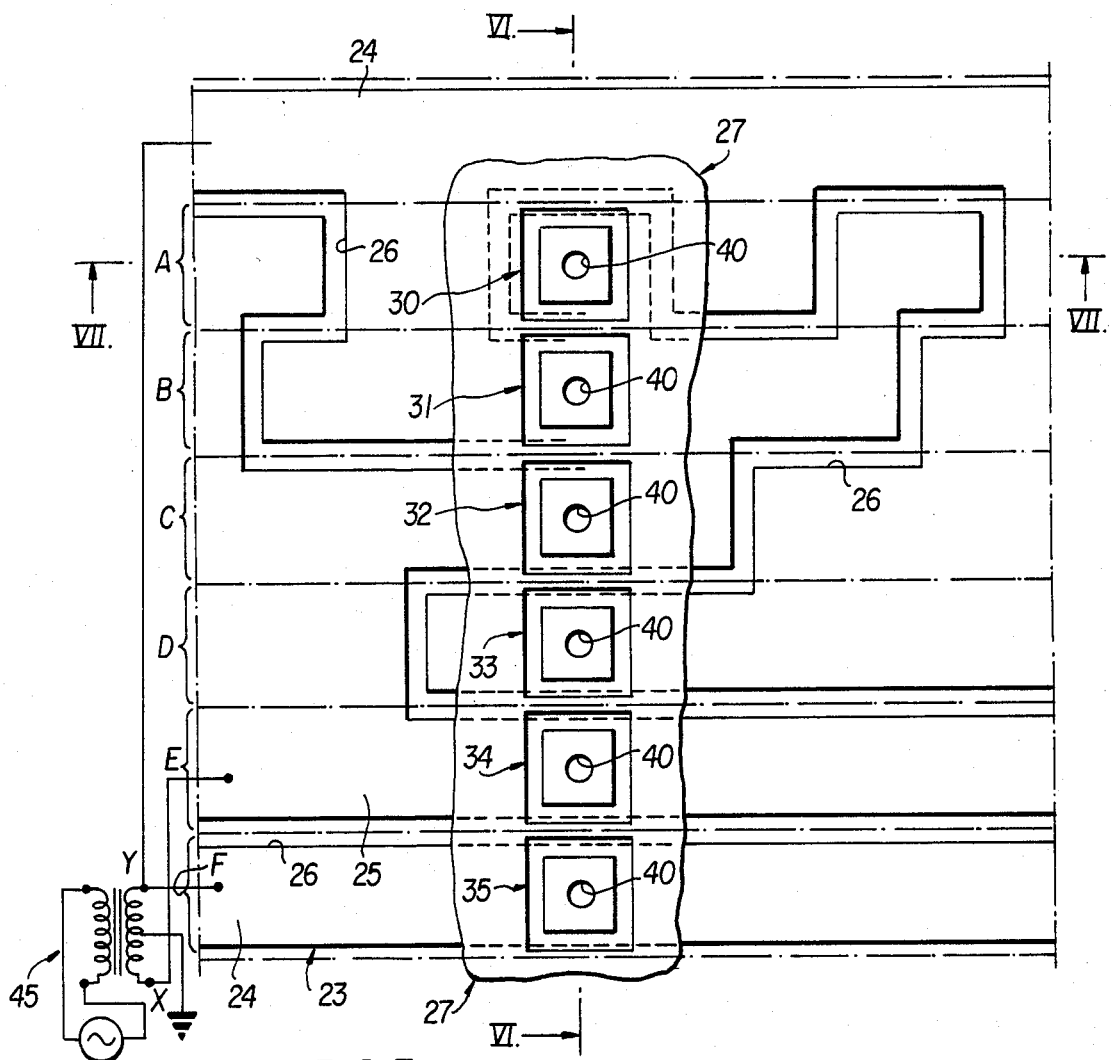
FIG. 5 shows in plan, considerably enlarged, a short section of the absolute transducer according to the invention, with indication of a group of pickups of the slider, disposed in a generic reading position.

The embodiment which will be described is the one chosen to best evidence the extreme case and low cost with which the absolute part of the transducer of the invention can be constructed using the same technique and the same means of production needed to construct the cyclic precision transducer of known type together with which it will be used.

FIG. 1 shows a transducer of known type as described in Italian Pat. No. 904,565 (U.S. Pat. No. 3,522,568) formed by a scale 10 comprising an electric winding 11 produced by photo-engraving a conductive strip glued by adhesive 12 on a tape 13 of spring steel and electrically insulated therefrom. The tape is stretched so as to assume the exact length provided during construction and is then rigidly fixed at both ends by screws 14, for example on the side of one of the tables of a machine tool. The transducer comprises also a slider 15 carrying two separate electric windings 16 and 17 constructed by photo-engraving as described for the scale 10. The form of the three windings (two on the slider, one on the scale) is such that, as winding II secured on the scale is excited with an alternating current, there are induced in the two windings 16 and 17 secured on slider 15 potentials proportional respectively to the sine and cosine function of the electrical angle between the winding of scale 10 and that of slider 15 relative to a scale cycle (it being undrstood that an angle of 360° corresponds to one scale cycle).

FIG. 3 illustrates the transducer of the invention constructed by using the same technique and for the most part the same devices as for the above described known transducer.

Figure 7:
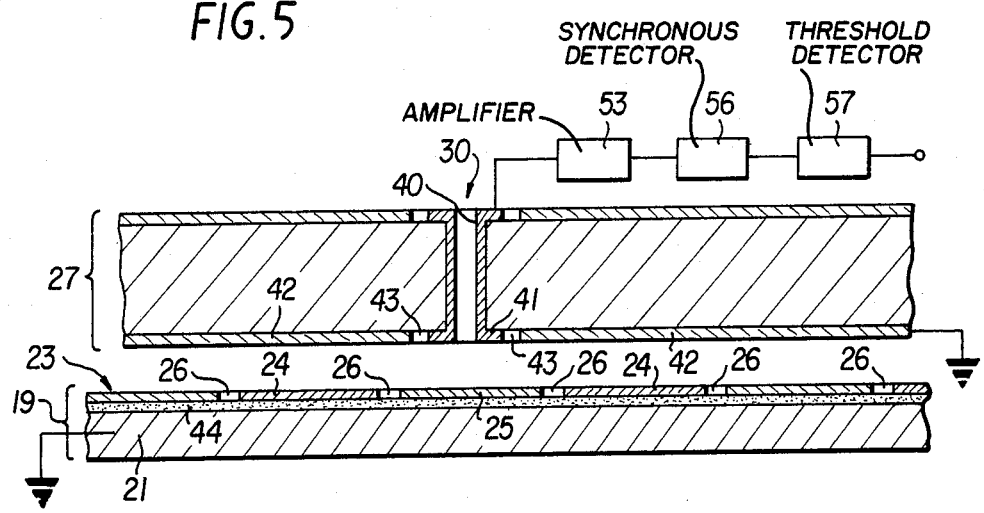
FIG. 7 shows a section along line VII—VII of FIG. 5.
Figure 6:
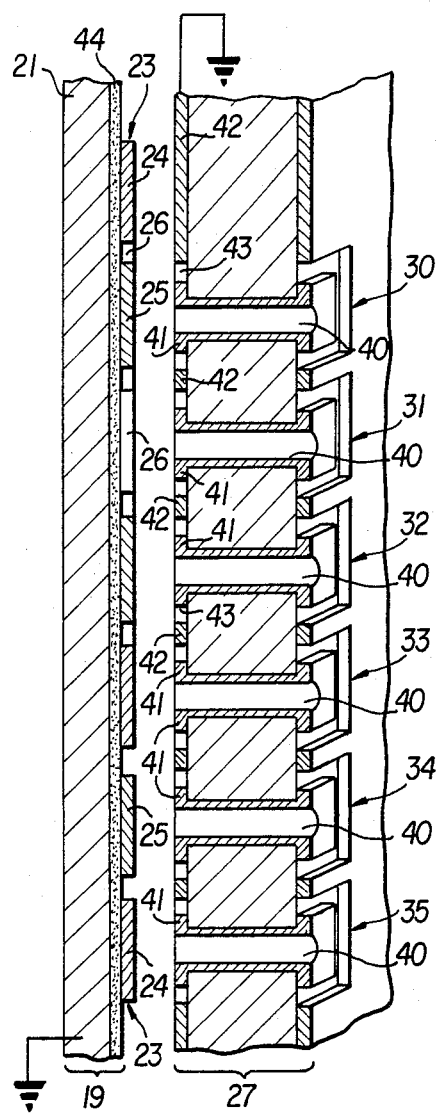
FIG. 6 shows a section along line VI—VI of FIG. 5 with perspective indication of the conductors for connection at the signal output points.

The new type of transducer 19 carries on a conductive strip 20 insulated from the steel support 21, in addition to the winding 22 of the cyclic transducer of known type, an absolute transducer 23 formed by two conductive zones 24 and 25 electrically separated from each other by a photo-engraved cut 26 which forms the digital position coding. In this particular example, the photo-engraved separating line has a form such as to generate a Gray type binary code. A greatly enlarged plan view of this codified zone is illustrated in FIG. 5, where the zone is subdivided into codified strips A, B, C, D, E and F of incresasing binary weight. If, for example, twelve codified strips are used, $2^{12}$ positions will be codified strips are shown in FIG. 3 to occupy a transverse space equal to that occupied by the cyclic transducer. In this type of transducer the slider 27 presents, in addition to the windings 28 and 29 entirely similar to the windings 16 and 17 described in the known type, a series of pickups 30, 31, 32, 33, 34 and 35 photo-engraved on the slider 27. In FIGS. 6 and 7 is seen an enlarged section of the transducer 19 and of the slider 27 face to face in their normal working position.

The reading of the code occurs by means of the pickups photo-engraved on the slider 27 best shown in FIGS. 6 and 7, held by known means at a distance of a few tenths of a millimeter from the scale 19. Also the slider 27 is constructed by photo-engraving and is, in fact, a normal printed circuit with metallized holes 40 to interconnect, where necessary, the two photo-engraved faces. The part of the slider held in front of the scale has photo-engraved on it metallized conductors 41, which as has been seen are also said pickups, completely surrounded by a conductive strip 42 isolated from them by the photo-engraved cut 43; there is on the slider 27 a conductor for each binary weight codified on the scale.

The conductive part 42 serves as shield so that each conductor 41 is capacitively coupled only with the codified strip of the corresponding digital weight. Still in FIGS. 6 and 7, in which the device of FIGS. 3 and 4 is seen better, part 21 is formed by a supporting steel tape, layer 44 is the adhesive and insulation which holds the conductive layer 23. The photo-engraved cut 26 electrically separates the conductive foils 24 and 25 so that they can be connected to sources of different potentials. The two foils are in fact connected to two sources of alternating potential of the same frequency but opposite phase, namely foil 25 is connected to the X phase of oscillator 45 of FIG. 5, and foil 24 to the Y phase.

In FIG. 7, when conductor 41 is on top of foil 25, the capacitive coupling is with phase X; now if slider 27 is shifted until conductor 41 is completely on foil 24, the capacitive coupling will be with phase Y opposed to that of the preceding case.

When the conductor 41 is centered on the photo-engraved cut 26, being thus coupled with both foils 24 and 25, the voltage capacitively induced on the conductor 41 will tend to zero, that is, to the mean of the values induced between phase X and phase Y. Therefore, by noting the phase of the voltage induced on conductor 41, it can be learned on which codified foil, e.g. 24 or 25 of FIG. 7, the conductor is located. To do this, there is placed in the rear face of the slider, i.e. on the second face of the printed circuit, an amplifier schematically indicated by 53, followed by a synchronous detector schematically indicated by 56 (the latter devices will be described and illustrated later on) appropriately phased so as to have as output a d-c voltage of one polarity when the conductor is on foil 24 and of opposite polarity when it is on foil 25. The above mentioned amplifier is placed very close to conductor 30 to minimize the attenuation of the signal due to stray capacity.

Figure 8:
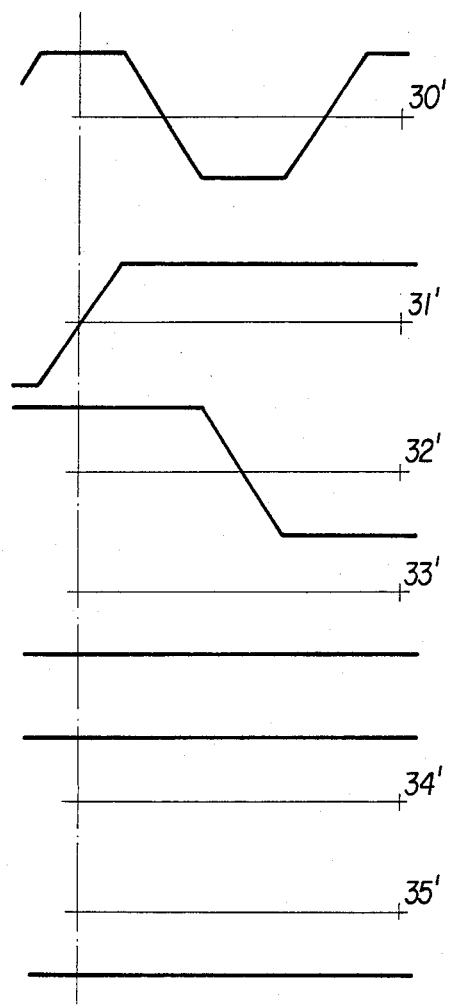
FIG. 8 shows the course of the output signals from the various pickups suitably processed.

In FIG. 8, by 30' is indicated the diagram for a complete cycle of the output signal of the synchronous detector relative to pickup 30 of FIG. 5 or 6 while it runs through the codified strip A with origin in the position illustrated in FIG. 5. By 31' in FIG. 8 is indicated the diagram for a half cycle of the output signal relative to pickup 31 of FIG. 5 while it runs through the codified strip B with origin in the position illustrated in FIG. 5. By 32' in FIG. 8 is indicated the diagram for a quarter cycle of the output signal relative to pickup 32 of FIG. 5 while it runs through the codified strip C with origin in the position illustrated in FIG. 5. By 33', 34' and 35' are indicated the diagrams of the signals relative to the pickups 33, 34 and 35 of FIG. 5 while they run through the codified strips D, E and F with origin in the position of FIG. 5.

The synchronous detector 56 is followed by a threshold circuit 57—it, too, will be better illustrated hereafter—with the threshold positioned at zero volt and with binary output.

If each of the conductors or pickups is connected to a circuit as described above, namely amplifier, synchronous detector and binary threshold circuit, there occurs at the output of the threshold circuits a code corresponding to the one photo-engraved on the conductive foil of the scale and corresponding to the position in which the pickups are relative to the scale.

To minimize the cost of the circuit with respect to the scheme described above, the circuit illustrated in FIG. 9 is used. Instead of using a separate channel for each pickup as previously illustrated, a single amplification and detection channel is used switched toward the various pickups by means of cheap electronic switches.

Figure 9:
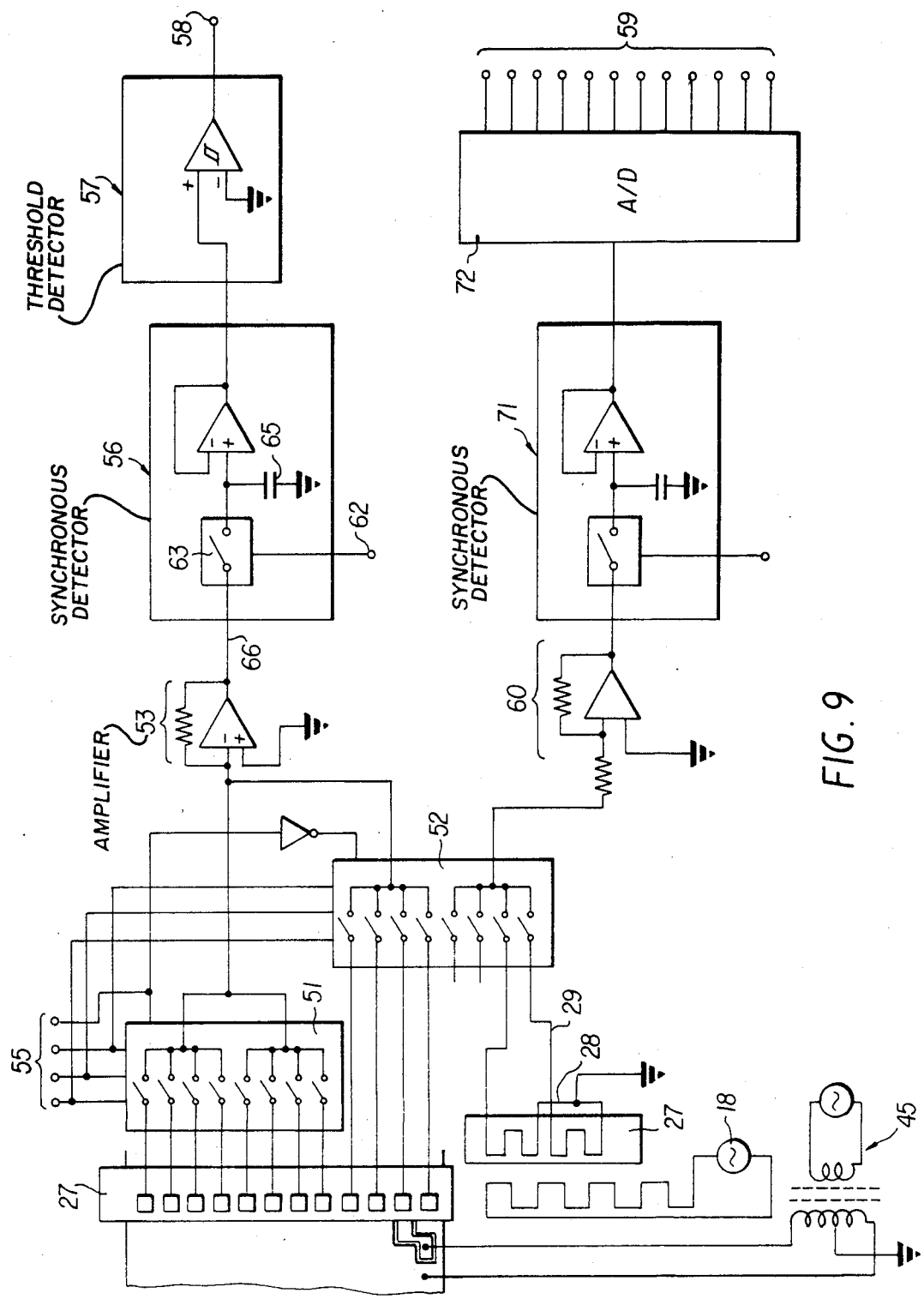
FIG. 9 shows the diagram of the circuit applied to the device proposed by the invention.

In the circuit of FIG. 9 are used two integrated circuits 51 and 52 in CMOS technology, each with eight electronic switches, by means of which the amplifier 53 can be connected to any pickup of slider 27.

In FIG. 9, as is seen, a slider 27 has been shown provided with twelve pickups rather than six as described and illustrated before; this, of course, leaves unchanged the characteristics of the device, but allows the connected circuit to be described in the most general and complex case.

The desired connected between pickups and amplification and detection chain is established by means of a selection code applied to lines 55 from a central control unit. The central control unit is of substantially known type, formed for example by a microprocessor unit programmed to control the selection lines 55 as well as the acquisition of the data of line 58 and the lines 59.

Amplifier 53 is followed by a synchronous detector 56 and by a threshold circuit 57 (with threshold at zero) having a small hysteresis to obtain at output 58 stable binary switchings. The synchronous detector 56 is actuated by means of line 62 by a closing control of switch 63 which is short in relation to the period of oscillator 45 (see also FIG. 5) which excites the scale of the absolute transducer. This control pulse is synchronous and phased with respect to oscillator 45 so as to sample the signal coming from the pickups placed on the slider at the peak of the maximum signal.

Switch 63 is followed by the memory capacitor 65, the potential of which is cyclically revised (updated) to the—positive or negative—peak value of the signal applied at point 66. With this system, by controlling with a binary sequence the selection lines 55, one obtains at the output 58, in serial form, that is, in succession in time, a code corresponding to that photo-engraved on the conductive foil of scale 23 and corresponding to the position of the pickups 30 to 35 relative to the scale.

A similar amplification system is used to amplify the signals coming from the two windings 28 and 29 of slider 27, of the cyclic transducer. In this case, the system is formed by two electronic switches of the integrated circuit 52 which serve to select, controlled by the selection lines 55, the sine channel or the cosine channel of slider 27 of the Inductosyn type cyclic transducer; to the switches is connected an amplifier 60 followed by a synchronous detector 71. Detector 71 is similar to the previously described detector 56, but synchronized with the oscillator 18 which feeds the scale of the cyclic transducer (see also FIGS. 1 and 3).

Detector 71 is followed by an analog-digital converter 72 which supplies to the control unit a digital value proportional to the peak value of the voltage coming from the windings placed on the slider of the cyclic transducer.

The use of a single amplification and conversion chain switched between the two channels, namely between the sine channel and the cosine channel of the cyclic transducer, is of utmost practical usefulness because it guarantees identity of gain between the two channels.

In this way, the ratio between the digital values at the output of converter 72 relative to the voltages coming from the two windings of the slider of the cyclic transducer is independent of the gain of the amplification and conversion channel. This makes the system quite economical because it is not necessary to use precision amplifiers, as the reading precision of the transducer is dependent, not on the absolute values, but simply on the ratio between the signals coming from the two windings of the slider.

To be certain to be able to identify correctly with the absolute transducer the individual cycles of the cyclic transducer, the discrimination of the absolute transducer is chosen equal to ½ cycle of the cyclic transducer.

In this way, to ensure correct interpretation of the absolute position, the relative error of alignment and of reading between the two transducers must simply be less than ½ cycle of the cyclic transducer.

To ensure the alignment and to minimize the cost, in the example, the two transducers (FIG. 3) are photo-engraved on the same conductive layer glued on a single steel tape.

It should be noted that in this way all operations relating to the manufacture of the complete scale for the two transducers, the cyclic and the absolute, are performed simultaneously; for example, there is a single gluing operation of the conductive layer on the steel tape, a single operation of depositing the photo-sensitive resist, a photographic exposure made with a single negative carrying the masks relating to the two transducers, a single operation of developing, and lastly a single operation of engraving.

As an alternative, the two conductive layers relating to the two transducers may be placed on opposite faces of the steel tape, or the absolute transducer may be constructed entirely by itself and joined to a cyclic transducer of known type only when taken into use.

A particularly interesting solution which minimizes the space used is to superpose the absolute transducer on the cyclic transducer. In this case, the scale will be formed by the following superposed layers: Base material, typically steel; insulation and adhesive; conductive layer, typically in the form of a copper foil with the winding of the scale photo-engraved; insulation and adhesive; conductive layer of non-magnetic material, typically copper with the absolute transducer photo-engraved as described before.

Since the cyclic transducer is based on induction across magnetic fields, the superposition of a conductive but non-magnetic layer does not introduce appreciable measurement errors.

What is exemplified above for a linear transducer is equally applicable to a cyclic angular transducer of known type, as for example the rotary Inductosyn.

To avoid ambiguity at the point where the code corresponding to 360° is contiguous with the code of zero degrees, there must be added a pickup on the slider and a conductor on the scale so as to obtain an additional signal which identifies that particular situation.

There has thus been obtained a type of absolute transducer which joins to the cyclic analog transducer-able to plot the position only within a cycle or within a period-an absolute, digital type position transducer which permits plotting also in which cycle the slider is relative to the scale. In this way, one obtains a direct reading of both values without the need to use auxiliary position reading devices, which are usually very expensive.

A preferred embodiment of the device proposed by the invention has now been illustrated, but it is understood that variations of form can be made therein, such as those indicated above, without taking anything away from the scope of the invention itself, as also protected by the following claims.

What is claimed is:

1. A position measuring transducer comprising:
   first and second relatively movable members having mutually spaced, opposed surfaces;
   a first electrical conductor pattern on the opposed surface of said first member, said first pattern comprising a plurality of uniformly spaced conductors positioned perpendicularly to the path of relative motion of said members; the spacing of said conductors defining a measurement cycle;
   at least one second electrical conductor pattern on the opposed surface of said second member, said second pattern comprising a plurality of uniformly spaced conductors positioned perpendicularly to the path of relative motion of said members, said second pattern having substantially the same spacing as said first pattern, and being inductively coupled to said first pattern;
   electrical circuit means for connecting an alternating source of electrical voltage to one of said first and second patterns and for connecting a voltage detector to the other of said first and second patterns, whereby the voltage detector gives an indication of the relative position of said two members within a measurement cycle;
   a third electrical conductor pattern on the opposed surface of said first member, said third pattern comprising two zones separated by a nonconductive space, a first zone having a plurality of electrically connected strips running parallel to the path of relative motion of said members, each of said strips having uniformly spaced finger portions, a first strip having finger portions of one measurement cycle width and separated by one measurement cycle width, the remaining strips having finger portions and spaces of equal widths, the widths for each remaining strip being equal to $2^n$ times the measurement cycle, where n is an integer, and a second zone surrounding at least in part said first zone;
   a fourth electrical pattern on the opposed surface of said second member, said fourth pattern comprising a plurality of pickup electrodes, each of said pickup electrodes opposing and being capacitively coupled to a different strip on said third pattern; and
   circuit means for connecting said two zones of said third pattern to an electrical energy source and for connecting each of said pickup electrodes of said fourth pattern to a voltage detector, whereby the sequential detection of the signal outputs from said voltage detectors gives an indication of one of a plurality of measurement cycles.

2. An absolute position measuring transducer comprising:
- a precision cyclic measurement transducer having inductively coupled conductive patterns on opposed surfaces of two relatively movable members, each of said patterns having uniformly spaced conductors, said spacing being defined as a measurement cycle, whereby external electrical circuitry can be connected to said patterns to give an indication of the relative position of said members within a mesurement cycle; and
- a binary coded measurement transducer having capacitively coupled a first conductive pattern on one opposed surface of said members, said first pattern having a plurality of strips, each strip being electrically connected to each other, and each strip having alternating widths and spaces, said widths and spaces of each strip being related to each other by a factor equal to $2^n$ times the measurement cycle, where n is zero or a positive integer, and a second pattern on the other opposed surface comprising a plurality of pickup electrodes, each of said electrodes being aligned with one of said strips, whereby an electrical voltage source can be connected to said first pattern and voltage detectors connected to said electrodes so that the voltages detected on said electrodes gives an unambiguous indication of a particuar measurement cycle corresponding to a particular relative positioning of said members whereby a predetermined sequential measurement of the signal outputs from said voltage detectors gives a train of output pulses, said train being an unambiguous indication of one of a plurality of measurement cycles.

* * * * *